US012787733B2

(12) United States Patent
Gupta et al.

(10) Patent No.: US 12,787,733 B2

(45) Date of Patent: Nov. 3, 2026

(54) METHOD FOR FORMING AN INTERCONNECTION STRUCTURE

(71) Applicant: IMEC VZW, Leuven (BE)

(72) Inventors: Anshul Gupta, Leuven (BE); Zsolt Tokei, Leuven (BE); Stefan Decoster, Bertem (BE)

(73) Assignee: Imec vzw, Leuven (BE)

( * ) Notice: Subject to any disclaimer, the term of this patent is extended or adjusted under 35 U.S.C. 154(b) by 423 days.

(21) Appl. No.: 18/514,461

(22) Filed: Nov. 20, 2023

(65) Prior Publication Data

US 2024/0170328 A1 May 23, 2024

(30) Foreign Application Priority Data

Nov. 21, 2022 (EP) .................................... 22208458

(51) Int. Cl.
*H10W 20/00* (2026.01)

(52) U.S. Cl.
CPC ....... *H10W 20/081* (2026.01); *H10W 20/038* (2026.01); *H10W 20/056* (2026.01); *H10W 20/062* (2026.01)

(58) Field of Classification Search
CPC ............. H10W 20/081; H10W 20/054; H10W 20/071; H10W 20/063; H10W 20/435; H10W 20/0693; H10W 20/062; H10W 20/0633; H10W 20/069; H10W 20/056; H10W 20/038; H10P 50/71
See application file for complete search history.

(56) References Cited

U.S. PATENT DOCUMENTS

| | | | |
|---|---|---|---|
| 9,679,805 B2 | 6/2017 | Bouche et al. |
| 10,615,117 B2 | 4/2020 | Lin et al. |
| 11,239,156 B2 | 2/2022 | Karpov et al. |
| 11,270,913 B2 | 3/2022 | Park et al. |

(Continued)

FOREIGN PATENT DOCUMENTS

EP 3671821 A1 6/2020

OTHER PUBLICATIONS

Extended European Search Report and Search Opinion, Application No. EP 22208458.4, mailed May 22, 2023, 5 pages.

(Continued)

*Primary Examiner* — Kretelia Graham
*Assistant Examiner* — Nkechinyere Esiaba
(74) *Attorney, Agent, or Firm* — McDonnell Boehnen Hulbert & Berghoff, LLP

(57) ABSTRACT

A method includes forming and patterning a first dielectric over a substrate; covering the first dielectric with metal and planarizing the metal exposing a surface of the first dielectric and forming a first metal; forming a second dielectric over the first dielectric and the first metal; covering the second dielectric with metal and planarizing the metal exposing a surface of the second dielectric and forming a second metal; forming a mask over the second dielectric and the second metal; and transferring: a first sub-pattern of the mask into a first portion of the first metal to form a lower metal, a second sub-pattern of the mask into a first portion of the second metal and a second portion of the first metal to form a stacked metal, and a third sub-pattern of the mask into a second portion of the second metal to form an upper metal.

20 Claims, 13 Drawing Sheets

(56) References Cited

U.S. PATENT DOCUMENTS

| | | | | |
|---|---|---|---|---|
| 11,302,575 | B2 | 4/2022 | Anderson et al. | |
| 2019/0304836 | A1 | 10/2019 | Kikuchi et al. | |
| 2020/0350206 | A1 | 11/2020 | Ren et al. | |
| 2020/0388565 | A1 | 12/2020 | Lin et al. | |
| 2020/0411435 | A1 | 12/2020 | Liu et al. | |
| 2021/0143085 | A1* | 5/2021 | Cheng ................. | H10W 20/069 |
| 2021/0225705 | A1* | 7/2021 | Xie ..................... | H10W 20/063 |
| 2021/0366823 | A1 | 11/2021 | Bouche et al. | |
| 2021/0407895 | A1* | 12/2021 | Lin ..................... | H10W 20/069 |
| 2021/0407907 | A1 | 12/2021 | Yoo et al. | |
| 2022/0084942 | A1 | 3/2022 | Karpov et al. | |
| 2022/0093505 | A1 | 3/2022 | Jezewski et al. | |

OTHER PUBLICATIONS

Chen, H. P., Y. H. Wu, H. Y. Huang, C. H. Tsai, S. K. Lee, C. C. Lee, T. H. Wei et al. “Fully Self-Aligned Via Integration for Interconnect Scaling Beyond 3nm Node.” In 2021 IEEE International Electron Devices Meeting (IEDM), pp. 22-1. IEEE, 2021.

Kobrinsky, Mauro J. “On-die Interconnect Innovations for Future Technology Nodes.” In 2021 IEEE International Interconnect Technology Conference (IITC), pp. 1-3. IEEE, 2021.

* cited by examiner

METHOD FOR FORMING AN INTERCONNECTION STRUCTURE

CROSS-REFERENCE TO RELATED APPLICATIONS

The present application is a non-provisional patent application claiming priority to European Patent Application No. 22208458.4, filed on Nov. 21, 2022, the contents of which are hereby incorporated by reference.

FIELD OF THE DISCLOSURE

The present disclosure relates to a method for forming an interconnection structure.

BACKGROUND

Some modern circuit fabrication processes include forming electrical interconnection structures for interconnecting semiconductor devices in a functioning circuit, e.g. in the back-end-of-line (BEOL). An interconnection structure may include one or more interconnection levels or tiers, which are formed above the substrate supporting the active device regions. An interconnection level includes horizontal conductive paths or lines arranged in an insulating material layer. Conductive lines of different interconnection levels may be interconnected by conductive vias extending vertically through the insulating layers.

A conventional approach for forming an interconnection level is the "dual damascene process." According to this approach, horizontally extending trenches are etched in the insulating layer. Further, vertically extending via holes are formed in the insulating layer. Thereafter the trenches and via holes are simultaneously filled with a conductive material to form conductive lines in the trenches and conductive vias in the via holes. The process may be repeated to form a stack of interconnection levels.

Another approach for forming an interconnection level is to directly etch metal lines in a metal layer using e.g. single-patterning or multi-patterning techniques such as lithography and etching, self-aligned double patterning (SADP), or quadruple patterning (SAQP). Vias may be formed using subtractive etching of the patterned metal lines, wherein vias may be defined by non-recessed portions of the metal lines. Compared to the dual damascene process, a direct metal etch approach may facilitate interconnection level fabrication at more aggressive line pitches by avoiding challenges related to reliably filling narrow trenches with metal, among others.

In some cases it would be desirable to combine metal lines of different heights in a same interconnection level. However, current direct metal etch approaches are lacking in terms of ability to efficiently and reliably form an interconnection level with hybrid-height metal lines.

SUMMARY

In light of the above, this disclosure includes a method for forming an interconnection structure allowing forming of an interconnection level comprising metal lines of differing heights.

According to an aspect there is provided a method for forming an interconnection structure, comprising:

forming a first dielectric layer pattern over a substrate;

covering the first dielectric layer pattern with metal and planarizing the metal to expose an upper surface of the first dielectric layer pattern and form a first metal layer pattern;

forming a second dielectric layer pattern over the first dielectric layer pattern and the first metal layer pattern;

covering the second dielectric layer pattern with metal and planarizing the metal to expose an upper surface of the second dielectric layer pattern and form a second metal layer pattern, wherein the second dielectric layer pattern comprises a portion overlying a first portion of the first metal layer pattern, and the second metal layer pattern comprises a first portion overlying a second portion of the first metal layer pattern, and a second portion overlying a portion of the first dielectric layer pattern;

forming a mask pattern of a mask material over the second dielectric layer pattern and the second metal layer pattern, wherein the mask pattern comprises a first sub-pattern of mask features overlying the first portion of the first metal layer pattern, a second sub-pattern of mask features overlying the first portion of the second metal layer pattern, and a third sub-pattern of mask features overlying the second portion of the second metal layer pattern; and in an etching process comprising using the mask pattern as an etch mask, transferring: the first sub-pattern into the first portion of the first metal layer pattern to form a set of lower metal features, the second sub-pattern into the first portion of the second metal layer pattern and the second portion of the first metal layer pattern to form a set of stacked metal features, and the third sub-pattern into the second portion of the second metal layer pattern to form a set of upper metal features.

The method according to the present aspect can involve forming of an interconnection structure comprising hybrid-height metal features, i.e. metal features of different heights. In some embodiments, the metal features may be metal lines, wherein hybrid-height metal lines, i.e. metal lines of different heights, may be formed. The method is however not so limited but may also be used to form metal features in the form of pillars or metal features with arbitrary 2D layouts, exclusively or in combination with metal lines.

More specifically, the method allows forming of two consecutive interconnection levels, a lower and an upper interconnection level, wherein the set of lower metal features are arranged in the lower interconnection level, the set of upper metal features are arranged in the upper interconnection level, and the stacked metal features are arranged to span the lower and upper interconnection levels. It is hereby to understood that the first portion of the second metal layer pattern overlies and is formed in electrical contact with the second portion of the first metal layer pattern.

The hybrid-height metal feature interconnection structure is enabled by the stacking of the first and second metal layer patterns which subsequently are etched using the mask pattern of the mask material. This is in contrast to a conventional direct metal patterning approach wherein metal features (e.g. metal lines) are patterned in a single blanket-deposited metal layer.

A potential benefit of the present method is that metal features of the first height, metal features of the second height, and metal features of the third height may be interleaved with each other. For instance, a subset of the stacked metal features (e.g. lines) may be formed between a subset of the lower metal features (e.g. lines) and a subset of the upper metal features (e.g. lines). As further may be appreciated, the metal features may be formed in a staggered fashion in the sense that the lower metal features and the upper metal features may be arranged at different vertical levels over the substrate.

The term "covering the first/second dielectric layer pattern with metal" as used herein means that a first/second metal layer is formed to cover and surround the first/second dielectric layer pattern. The first/second metal layer is subsequently planarized to form the first/second metal layer pattern. The metal may be deposited on top of (e.g. in direct contact with) the first/second dielectric layer pattern (and in the case of the second metal layer pattern in direct contact with the first metal layer pattern). The (first/second) metal layer may each be formed of a single metal layer or a stack of metal (sub-)layers of different metals, for instance a stack of a metal liner (sub-)layer and a metal fill (sub-)layer.

Relative spatial terms such as "upper," "lower," "top," "bottom," and "stacked on top of" are herein to be understood as denoting locations or orientations within a frame of reference relative to the substrate. In particular, the terms may be understood as locations relative a normal direction to a main surface or main plane of extension of the substrate (equivalently a vertical direction). Conversely, terms such as "lateral" and "horizontal" are to be understood as locations or orientations parallel to the substrate, i.e. parallel to the main surface/main plane of extension of the substrate.

The term "height" as used herein accordingly denotes a dimension as seen along the vertical direction. Also the term "thickness" is to be understood in this sense unless stated otherwise.

The term "planarizing" (e.g. as in "planarizing the metal") as used herein denotes subjecting an initial surface (e.g. an upper surface of deposited metal or layer) to a planarization process to produce a planar surface (wherein the surface initially may have a varying topography). For example, the act of "planarizing" may comprise chemical mechanical polishing (CMP).

The term "using a feature as an etch mask" (where the "feature" refers to a feature such as a layer or a line) as used herein means that one or more underlying layers are etched while the feature counteracts etching of portions of the underlaying layer(s) masked by the feature (i.e. portions overlapped or covered by the feature).

In some embodiments, the first sub-pattern may further be transferred into the portion of the second dielectric layer pattern to form a set of dielectric features, wherein the lower set of metal features are capped by the set of dielectric features. This may facilitate connecting the lower metal features with vias by enabling forming of via holes self-aligned to the lower metal features (by selective etching of the dielectric features). Various embodiments for via formation are further set out in the following.

In some embodiments, forming one of the first and the second dielectric layer pattern may comprise forming a dielectric layer and patterning a set of openings in the dielectric layer, and wherein forming the other one of the first and second dielectric layer pattern may comprise forming a dielectric layer and patterning a set of dielectric blocks in the dielectric layer. Hence, a set of openings may be patterned in the first dielectric layer (e.g. using a lithography and etching process) and a set of dielectrics blocks may be patterned in the second dielectric layer (e.g. using a lithography and etching process), or vice versa.

The term "openings" is hereby used to refer to cavities etched through the first or second dielectric layer. The first/second metal layer pattern may accordingly fill the set of openings in the first/second dielectric layer. The first/second metal layer pattern may accordingly be defined by a set of first/second metal layer pattern parts, each pattern part formed in a respective opening in the first/second dielectric layer pattern.

The dielectric blocking pattern defines regions in which no stacked metal features are to be formed. The first/second metal layer pattern may surround the dielectric blocks of the first/second dielectric layer pattern.

The mask material of the mask pattern may be a hard mask material, e.g. a dielectric hard mask material.

Forming the mask pattern may comprise forming a mask layer of the mask material over the second dielectric layer pattern and the second metal layer pattern and patterning the mask layer to form the mask pattern.

In some embodiments, the method may further comprise depositing an interlayer dielectric to embed and cover the sets of metal lines and the mask line pattern of the mask material, and planarizing the interlayer dielectric to expose an upper surface of mask line pattern.

The upper surface of the mask line pattern may be used for end point detection for the planarizing (i.e. planarization process e.g. CMP) of the interlayer dielectric. In other words, the planarizing of the interlayer dielectric may be stopped in response to detecting the upper surface of the mask line pattern.

The mask pattern may comprise a pattern of mask lines of the mask material. This enables forming of metal features in the form of metal lines (e.g. lower, upper, and stacked metal lines).

The mask line pattern may comprise a grating of lines of the mask material. This enables a relatively large area of mask material (e.g. hard mask material) for end point detection for the planarization process applied to the interlayer dielectric.

In some embodiments, the method may further comprise method steps for forming metal vias on top of the lower, upper, and/or stacked metal features (e.g. metal lines).

The method may comprise patterning a first via hole thereby exposing an upper surface of a first lower metal feature, the first via hole extending through a first mask feature of the mask pattern overlying the first lower metal feature (and a first dielectric feature overlying/capping the first lower metal feature); and forming a first metal via in the first via hole.

The method may additionally or alternatively comprise patterning a second via hole thereby exposing an upper surface of a first stacked metal feature and extending through a second mask feature of the mask pattern overlying the first stacked metal feature; and forming a second metal via in the second via hole.

The method may additionally or alternatively comprise patterning a third via hole thereby exposing an upper surface of a first upper metal feature and extending through a third mask feature of the mask pattern overlying the first upper metal feature; and forming a third metal via in the third via hole.

In each of these cases, via formation (e.g. first, second, or third) may be achieved without any metal etch back but by forming respective via holes (in which metal vias are subsequently formed). The mask feature of the mask pattern (as they overlie/overlap the underlying metal lines) facilitates aligning the via holes with the respective metal features.

Since the upper surfaces of the upper and stacked metal feature may be located at a same level above the substrate, the second and third via holes and metal vias may be of relatively low aspect ratio (LAR). The first via hole and metal via may have a relatively high aspect ratio (HAR) as it extends through the upper level to reach the upper surface of the lower metal feature.

Each one of the first, second, and third via holes may be patterned simultaneously, e.g. using a same via mask layer as etch mask.

Forming the first, second, and/or third via hole may comprise etching the mask material selectively to the interlayer dielectric. This enables the via holes to be formed to in a self-aligned manner to the metal lines.

Forming the first via hole may further comprise etching a dielectric material of the first dielectric feature capping the first lower metal feature selectively to the interlayer dielectric. Hence a lower portion of the first via hole may be formed in a self-aligned manner.

In some embodiments, the method may further comprise forming a metal liner (which may be denoted "upper metal liner") after forming the second dielectric layer pattern and the second metal layer pattern and subsequently forming the mask pattern on the metal liner. The (upper) metal liner may serve as a metal adhesion layer, facilitating adhesion of the mask material of the mask pattern, in particular of the portion(s) of the mask pattern overlying the second metal layer pattern. This may further increase the flexibility of the method with respect to material choices for the mask material and the second metal layer pattern.

The (upper) metal liner/adhesion layer may be deposited selectively on an upper surface of the second metal layer pattern. The metal liner may hence be formed selectively on the surfaces where improved adhesion may provide the most benefit. Additionally, by a selective deposition, sandwiching of metal liner portions between the second dielectric layer pattern and the mask pattern, which could create line to line shorts if not removed, may thus be avoided.

In embodiments comprising forming the (upper) metal liner, each upper metal feature and each stacked metal feature may comprise a respective thickness portion of the metal liner. Accordingly, each upper metal feature may comprise a thickness portion of the second metal layer pattern and a thickness portion of the metal liner, and each stacked metal feature may comprise a thickness portion of the first metal layer pattern, a thickness portion of the metal liner, and a thickness portion of the second metal layer pattern.

In some embodiments, the method may further comprise forming a metal liner (which may be denoted "lower metal liner") after forming the first dielectric layer pattern and the first metal layer pattern and subsequently forming the second dielectric layer pattern on the metal liner. The (lower) metal liner may serve as a metal adhesion layer, facilitating adhesion of the second dielectric layer pattern, in particular of the portion(s) of the second dielectric layer pattern overlying the first metal layer pattern. This may further increase the flexibility of the method with respect to material choices for the second dielectric layer and the first metal layer pattern.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Methods for forming an interconnection structure, suitable for instance for a semiconductor device, will now be described with reference to the figures. The methods will be described in connection with forming interconnection levels exemplified in the figures as a bottom interconnection level. It is however noted that the methods herein have a more general applicability and may be used for forming any interconnection level of a stack of interconnection levels of an interconnection structure. The methods herein allows forming of an interconnection structure comprising two consecutive levels, a lower and an upper level, wherein the interconnection structure comprises a set of lower metal lines in the lower level, a set of upper metal lines in the upper level, and a set of stacked metal lines spanning the lower and upper levels. Using a conventional notation for interconnection levels, the lower level may be denoted MX and the upper level may be denoted MX+1. While the illustrated examples refer to metal features in the shape of metal lines, it is to be noted that the method has a more general applicability and may be used to form hybrid-height metal features with arbitrary 2D layout, or hybrid-height metal pillars.

FIGS. 1-14 schematically illustrate method steps for forming an interconnection structure. Each one of FIGS. 1-14 shows in cross-section a device structure 100 at different stages of the method, except for FIGS. 5*b*, 6*b*, 9*b* and 13*b* which depict a top-down view of the device structure 100. In the figures, the X-axis and the Y-axis indicate first and second horizontal directions, respectively, parallel to a main plane of a substrate 102 of the device structure 100, and the Z-axis indicate a normal or vertical direction with respect to the substrate 102.

Figure 1:
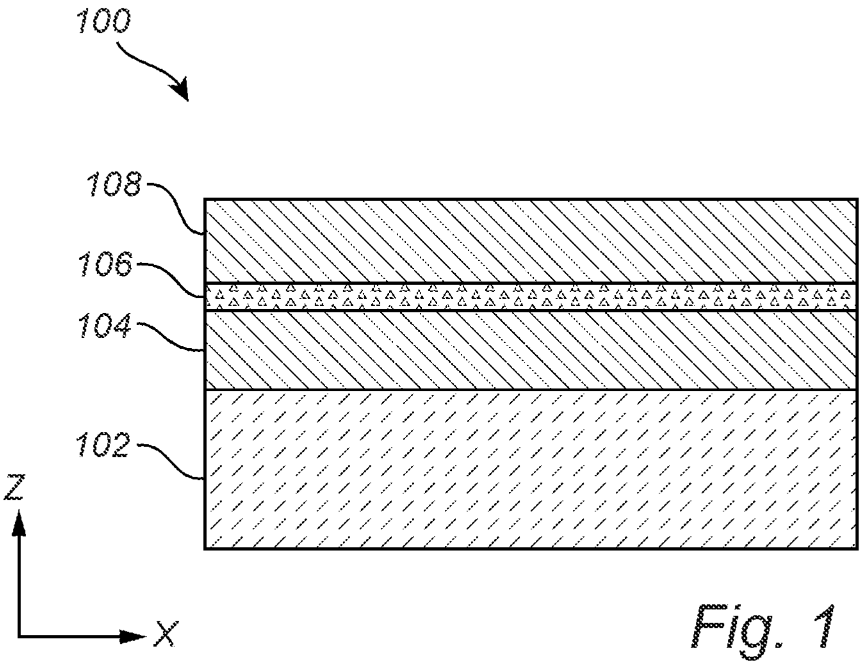
FIG. 1 schematically illustrates a method step for forming an interconnection structure, according to an example.

FIG. 1 shows an initial or starting device structure 100 for the method. The device structure 100 comprises a substrate 102, for instance a semiconductor substrate such as a silicon (Si) substrate, a silicon-on-insulator (SOI) substrate, a germanium (Ge) substrate, a SiGe substrate, or any other conventional type of substrate suitable for CMOS fabrication. Active device regions (not shown) including semiconductor devices such as transistors may be fabricated on a main surface of the substrate 102 during front-end-of-line (FEOL) processing. The substrate 102, including the active device regions, may be covered by an insulating layer structure comprising e.g. an interlayer dielectric 104 (e.g. of $SiO_2$ or another low-k oxide-based or other insulating material) and optionally a dielectric capping layer 106 (e.g. of SiN, AlN, or another dielectric hard mask material such as $AlO_x$ or SiOC). The dielectric capping layer 106 may be used as an etch stop layer (ESL) during subsequent etching steps and may accordingly be referred to as ESL. The interlayer dielectric 104 may embed a set of conductive structures. In case the interconnection level to be formed is a bottom interconnection level (e.g. M1) the conductive structures may be contact structures for the active device regions (e.g. in M0A). However, in case the interconnection level is a second or higher level interconnection level, the conductive structures may be metal lines and/or metal vias of a lower interconnection level.

A first dielectric layer 108 is formed over the substrate 102, more specifically on top of the insulating layer structure (e.g. interlayer dielectric 104 and the dielectric capping layer 106). The first dielectric layer 108 may, like the interlayer dielectric 104, be formed of $SiO_2$ or of another low-k insulating material (e.g. an oxide) suitable as interlayer dielectric in an interconnection structure. The first dielectric layer 108 may be formed using conventional deposition techniques such as chemical vapor deposition (CVD), flowable-CVD, or physical vapor deposition (PVD).

Figure 2:
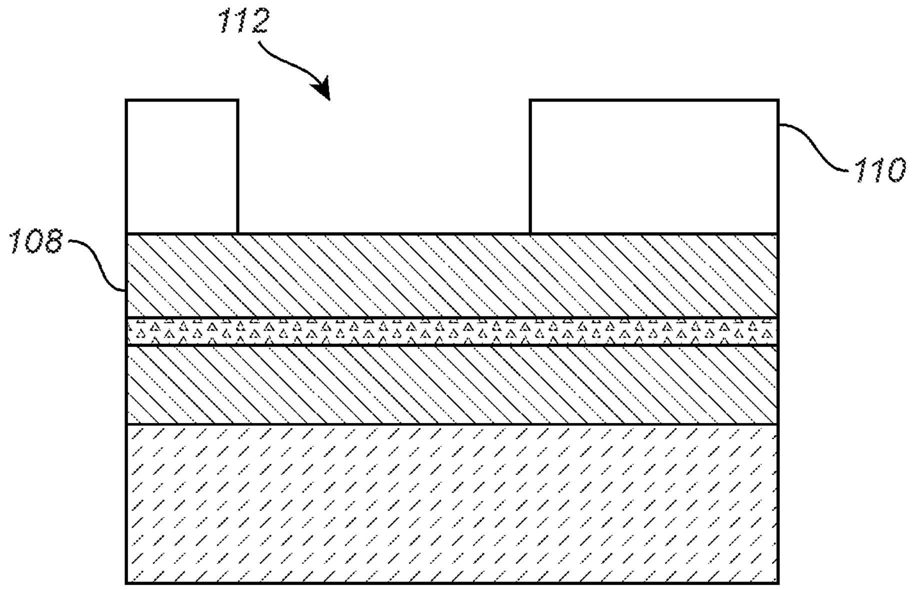
FIG. 2 schematically illustrates a method step for forming an interconnection structure, according to an example.

In FIG. 2, a mask layer 110 has been formed on top of the first dielectric layer 108. While schematically shown as a single layer structure, the mask layer 110 may in practice be a lithographic layer stack. As one example, a lithographic layer stack may comprise a spin-on-carbon/spin-on-glass (SOC/SOG) stack and a resist layer. A pattern of a set of openings 112 (of which FIG. 2 depicts a single opening but further openings may be formed outside the shown partial view of the device structure 100) has been patterned in the mask layer 110, e.g. using a lithography and etching process.

Figure 3:
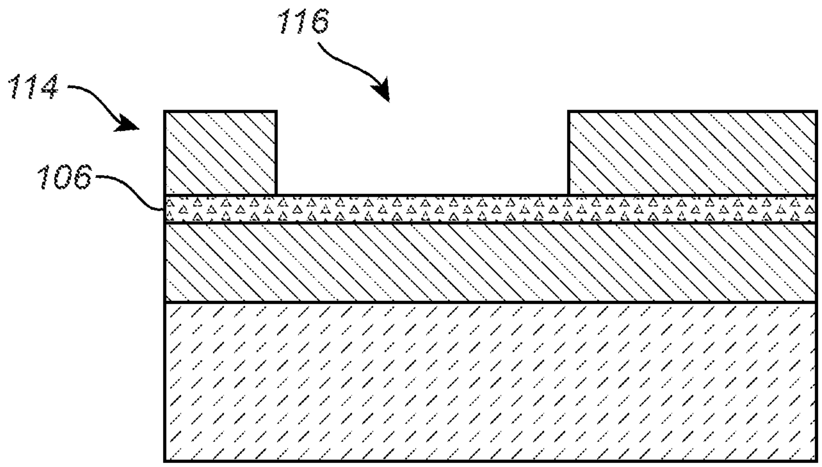
FIG. 3 schematically illustrates a method step for forming an interconnection structure, according to an example.

In FIG. 3, the set of openings 112 have been transferred into the first dielectric layer 108 by etching the first dielectric layer 108 while using the mask layer 110 as an etch mask. A first dielectric layer pattern 114 defining a pattern of a set of openings 116 conforming or corresponding to the set of openings 112 in the mask layer 110 has thus been formed. Each opening 116 may as shown be formed to extend completely through the first dielectric layer 108. The pattern transfer may comprise anisotropic or isotropic etching, wet or dry. The mask layer 110 may subsequently be removed.

Figure 4:
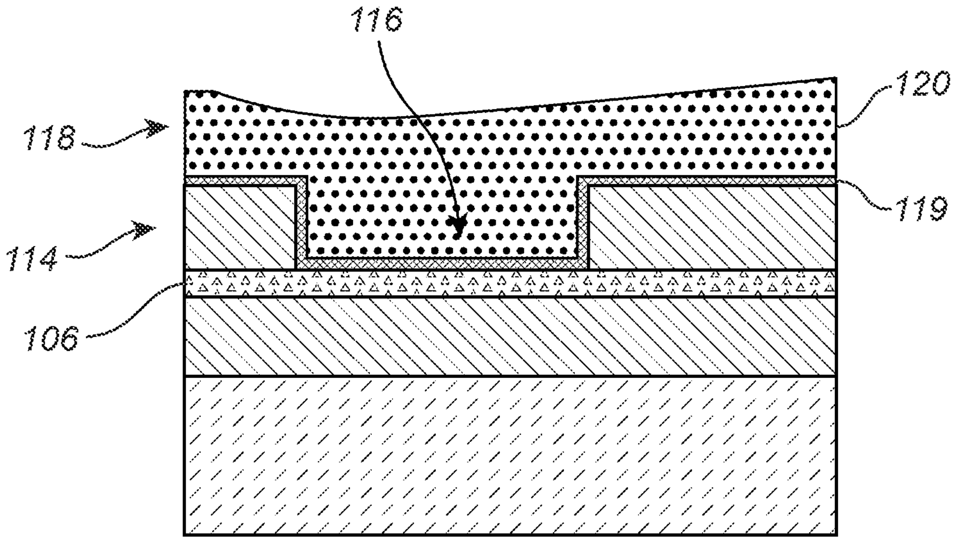
FIG. 4 schematically illustrates a method step for forming an interconnection structure, according to an example.

In FIG. 4 metal has been deposited to form a first metal layer 118 covering the first dielectric layer pattern 114 and filling the set of openings 116. Portions of the metal deposited outside the set of openings 116 defines a metal overburden. The first metal layer 118 may as shown comprise a stack of a metal liner layer 119 (e.g. of TiN or $TiO_2$) and a metal fill layer 120 (e.g. of Ru, Mo, W, Al, or Co, or combinations of sub-layers of one or more of the aforementioned metals). The metal liner layer 119 may be a conformal layer. By a conformal layer is hereby meant a layer with a uniform thickness and following a contour of the surface on which it is deposited. The metal fill layer 120 may be deposited to completely fill a (remaining) space of each opening 116. The metal fill layer 120 may be a non-conformal layer, i.e. with a non-uniform thickness. The metal liner layer 119 and the metal fill layer 120 may each be deposited using conventional deposition techniques, such as atomic layer deposition (ALD), CVD, PVD, or plating. While the metal liner layer 119 may facilitate adhesion of the metal fill layer 120, the metal liner layer 119 may however be omitted in case the metal fill layer 120 already presents sufficient adhesion to the device structure 100, e.g. the first dielectric layer pattern 114 and the insulating layer structure (e.g. interlayer dielectric 104 or the dielectric capping layer 106). In this case, the metal fill layer 120 may on its own form the first metal layer 118 and completely fill the set of openings 116.

While not shown in the figures, it is to be understood that prior to forming the first dielectric layer 108, a pattern of metal vias may be formed in the insulating layer structure, on top of conductive structures (e.g. contact structures or metal lines) embedded therein, to enable an electrical connection to the metal lines that are to be formed in the lower level (e.g. MX). The metal vias may e.g. be formed by patterning via holes in the insulating layer structure (e.g. through interlayer dielectric 104 and the dielectric capping layer 106) and filling the same with metal. A top surface of the metal vias may then be exposed in set of openings 112 patterned in the first dielectric layer 108 such that the first metal layer 118 may be formed in electrical contact with the metal vias. It is also possible to pattern via holes in the insulating layer structure after patterning the first dielectric layer 108, e.g. by etching via holes through the first dielectric layer 108 and the dielectric capping layer 106 from the set openings 112 patterned in the first dielectric layer 108. The via holes may then be filled by the first metal layer 118.

Figure 5A:
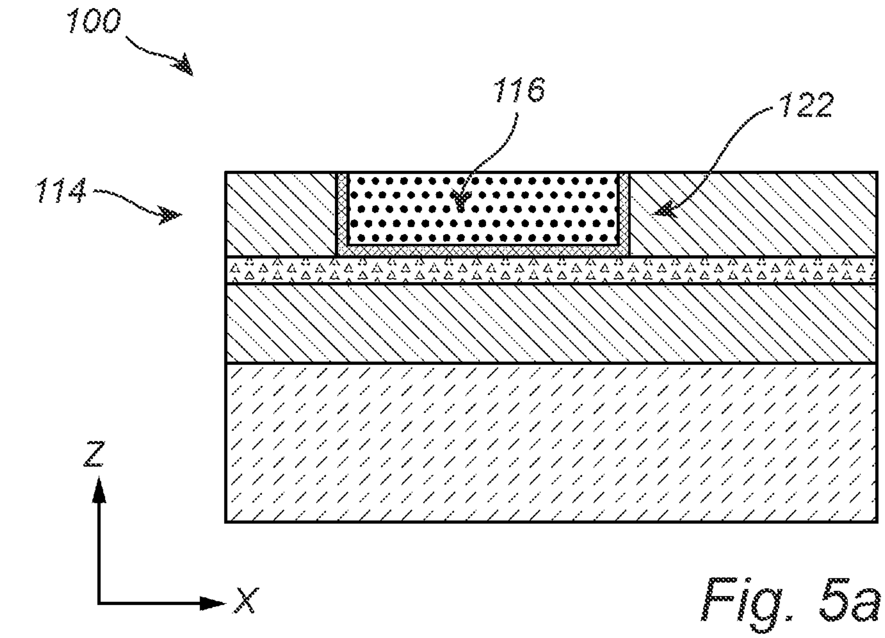
FIG. 5*a* schematically illustrates a method step for forming an interconnection structure, according to an example.
Figure 5B:
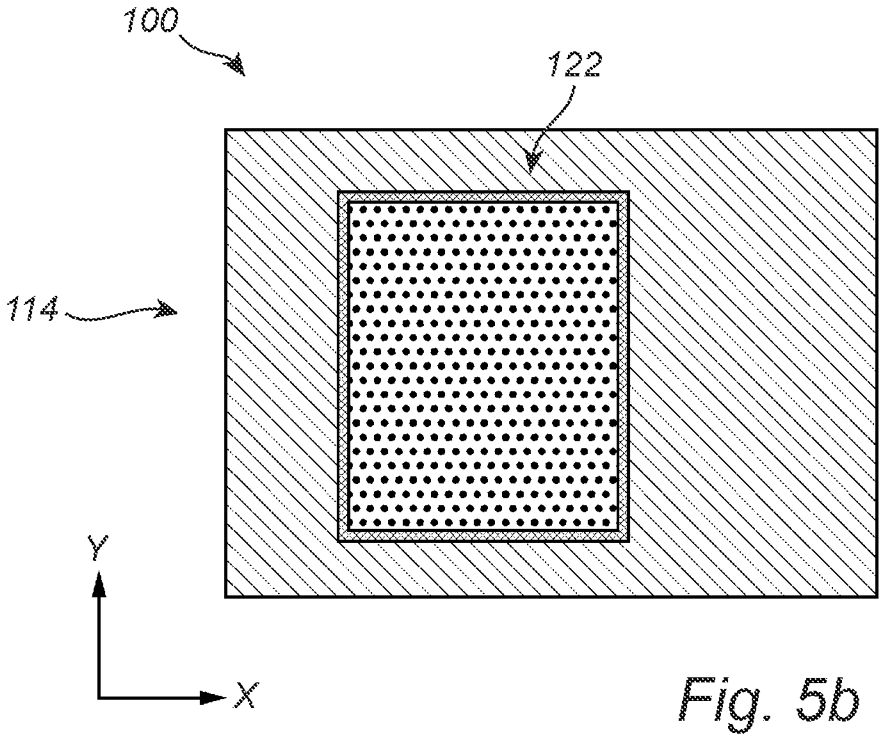
FIG. 5*b* schematically illustrates a method step for forming an interconnection structure, according to an example.

In FIGS. 5*a-b* the first metal layer 118 (e.g. comprising the metal liner layer 119 and the layer 120) has been subjected to a planarization process (e.g. CMP) to reduce a thickness thereof and expose an upper surface of the first dielectric layer pattern 114. The metal overburden is thus removed from the upper surface of the first dielectric layer pattern 114 such that a first metal layer pattern 122 is formed of the first metal layer 118 remaining in each opening 116. The planarization process may be stopped on the upper surface of the first dielectric layer pattern 114. An upper surface of the first metal layer pattern 122 may be flush with the upper surface of the first dielectric layer pattern 114 such that the first dielectric layer pattern 114 and the first metal layer pattern 122 together define a planarized upper surface of the device structure 100.

Figure 6A:
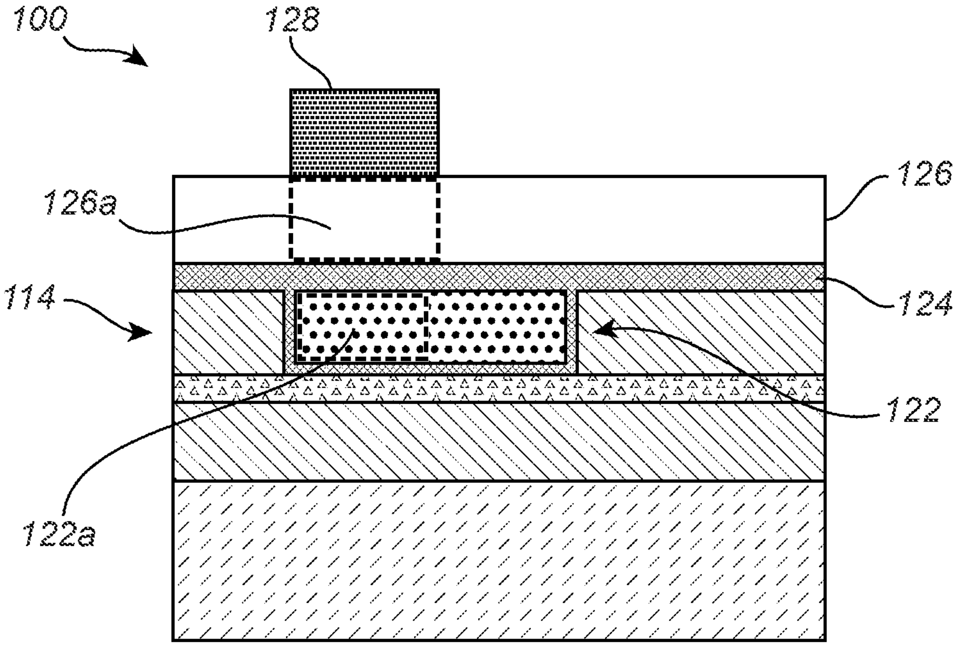
FIG. 6*a* schematically illustrates a method step for forming an interconnection structure, according to an example.
Figure 6B:
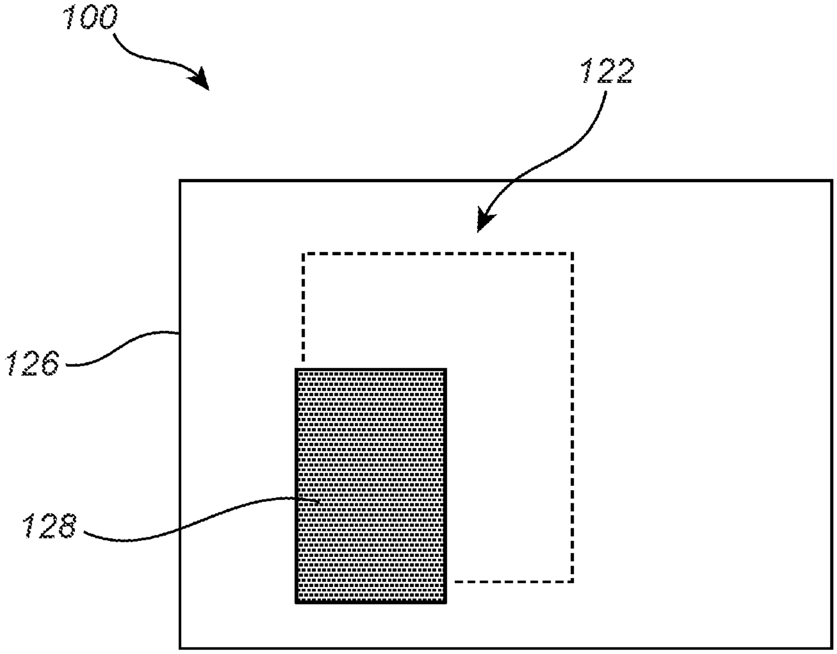
FIG. 6*b* schematically illustrates a method step for forming an interconnection structure, according to an example.

In FIGS. 6*a-b* a second dielectric layer 126 has been formed over the first dielectric layer pattern 114 and the first metal layer pattern 122. The second dielectric layer 126 may be formed of a dielectric material different from a material of the first dielectric layer 108 (and first dielectric layer pattern 114). The second dielectric layer 126 may for example be formed of a dielectric hard mask material, such as any of the materials mentioned in connection with the dielectric capping layer 106. The second dielectric layer 126 and the dielectric capping layer 106 may be formed of a same or a different material. As shown in FIG. 6*a*, a metal liner layer 124 may optionally be formed on top of the first dielectric layer pattern 114 and the first metal layer pattern 122 wherein the second dielectric layer 126 may be formed on top of the metal liner layer 124. The metal liner layer 124 may be a conformal layer. The metal liner layer 124 may for example be formed of a same material as the metal liner layer 119. Analogous to the discussion of the metal liner layer 119, the metal liner layer 124 may facilitate adhesion of a second metal layer 132 to be subsequently formed. The metal liner layer 124 may however be omitted in case the second metal layer 132 already presents sufficient adhesion to the device structure 100.

A mask layer 128 has further been formed on top of the second dielectric layer 126 and patterned to define a set of mask blocks (of which FIGS. 6*a-b* depicts a single block but further blocks may be formed outside the shown partial view of the device structure 100). While schematically shown as a single layer structure, the mask layer 128 may like the mask layer 110 be a lithographic layer stack (e.g. a SOC/SOG/resist layer stack), and be patterned using a lithography and etching process.

Figure 7:
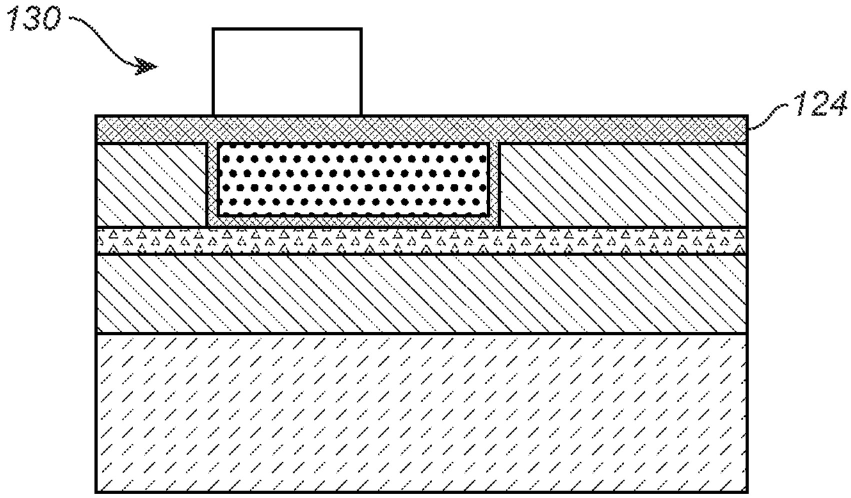
FIG. 7 schematically illustrates a method step for forming an interconnection structure, according to an example.

In FIG. 7 the pattern of mask blocks defined by the mask layer 128 has been transferred into the second dielectric layer 126 by etching while using the mask layer 128 as an etch mask. A second dielectric layer pattern 130 defined by a set of dielectric blocks conforming or corresponding to the pattern of mask blocks of the mask layer 128 has thus been formed. The dielectric blocks of the second dielectric layer pattern 130 may be formed using anisotropic or isotropic etching, wet or dry. The etching may be stopped on an upper surface of the metal liner layer 124, if present, or otherwise on the planarized upper surface of the first dielectric layer pattern 114 and the first metal layer pattern 122. The mask layer 128 may subsequently be removed.

Figure 8:
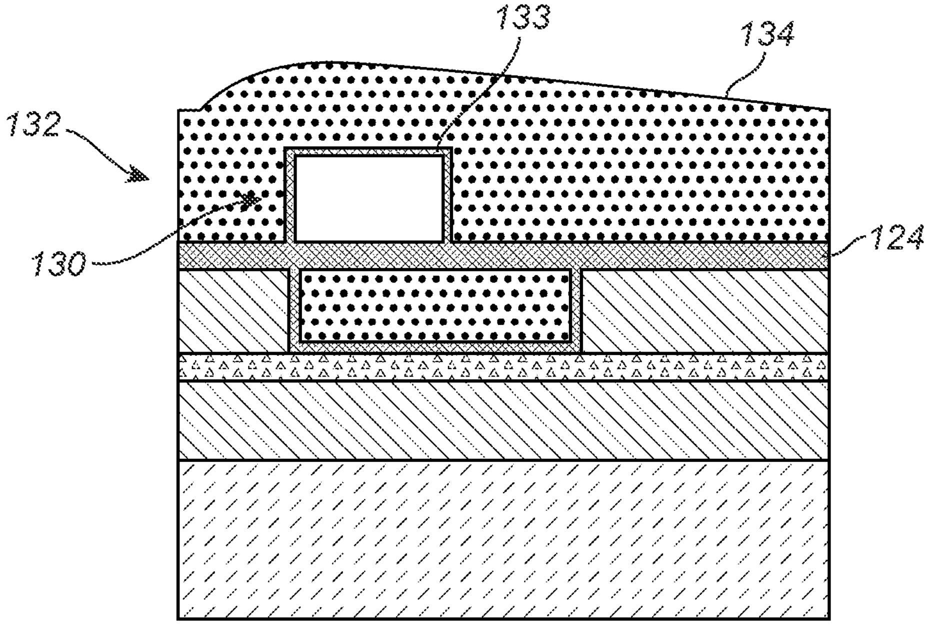
FIG. 8 schematically illustrates a method step for forming an interconnection structure, according to an example.

In FIG. 8 metal has been deposited to form a second metal layer 132 covering the second dielectric layer pattern 130. The set of dielectric blocks may as shown be fully encased or embedded in the second metal layer 132. The second metal layer 132 may as shown comprise a stack of a metal liner layer 133 and a metal fill or the layer 134. The metal liner layer 133 may be a conformal layer. The metal fill layer 134 may be a non-conformal layer, i.e. with a non-uniform thickness. The metal liner layer 133 and the metal fill layer 134 may respectively be formed using any of the deposition techniques, and of any of the materials, mentioned in connection with the metal liner layer 119 and metal fill layer 120, for instance of the same respective materials as indicated by the fill patterns in FIG. 8. Analogous to the discussion of the metal liner layer 119, the metal liner layer 133 may facilitate adhesion of the metal fill layer 134. The metal liner layer 133 may however be omitted in case the metal fill layer 134 already presents sufficient adhesion to the device structure 100, e.g. the second dielectric layer pattern 130 and the metal liner layer 124, or the first dielectric layer pattern 114 if the metal liner layer 124 is omitted.

Figure 9A:
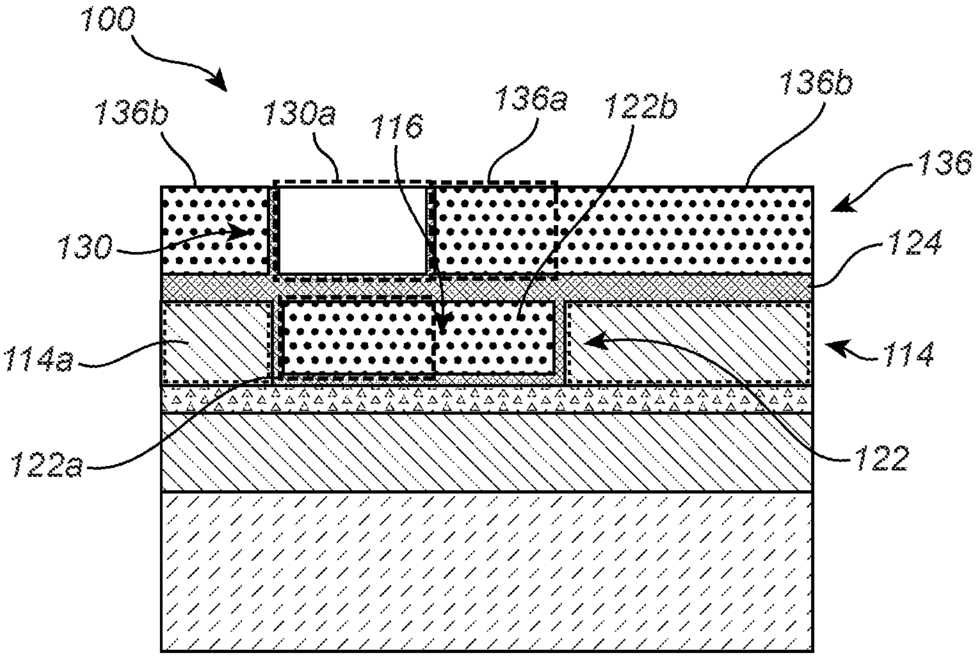
FIG. 9*a* schematically illustrates a method step for forming an interconnection structure, according to an example.
Figure 9B:
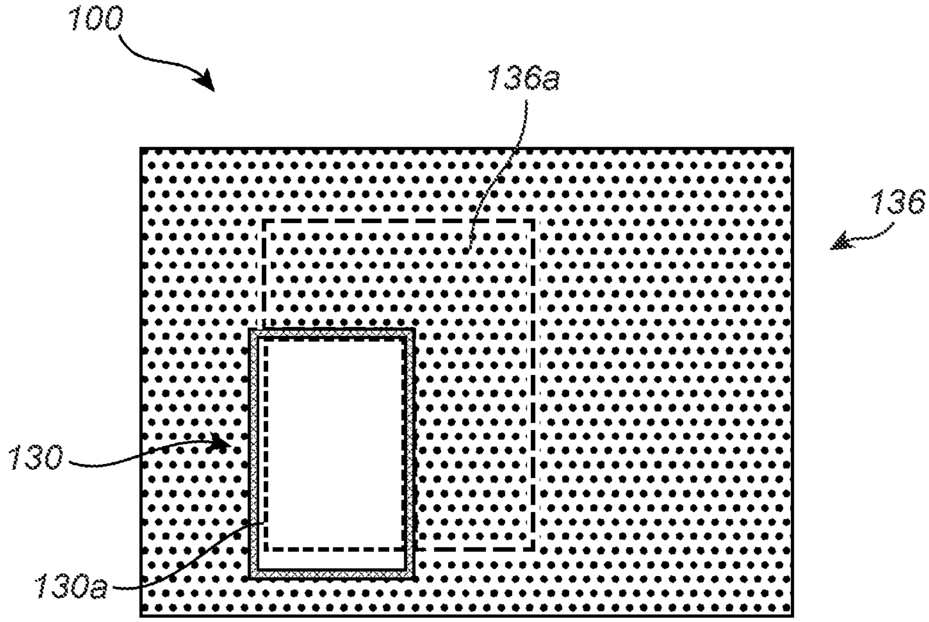
FIG. 9*b* schematically illustrates a method step for forming an interconnection structure, according to an example.

In FIGS. 9*a-b* the deposited metal/the second metal layer 132 (e.g. comprising the metal liner layer 133 and the layer 134) has been subjected to a planarization process (e.g. CMP) to reduce a thickness thereof and expose an upper surface of the second dielectric layer pattern 130. Metal overburden is thus removed from the upper surface of the second dielectric layer pattern 130 such that a second metal layer pattern 136 is formed of the second metal layer 132 remaining to surround the set of blocks of the second dielectric layer pattern 130. The planarization process may be stopped on (e.g. in response to detecting) the upper surface of the second dielectric layer pattern 130. An upper surface of the second metal layer pattern 136 may be flush with the upper surface of the second dielectric layer pattern 130 such that the second dielectric layer pattern 130 and the second metal layer pattern 136 together define a planarized upper surface of the device structure 100.

Accordingly, at the stage of the method depicted in FIGS. 9*a-b*, an intermediate layer stack for an interconnection structure has been formed over the device structure 100. The intermediate layer stack comprises a first level (e.g. MX) and a second level on top of the first level (e.g. MX+1). The first level (MX) comprises the first metal layer pattern 122 and the first dielectric layer pattern 114. The second level (MX+1) comprises the second metal layer pattern 136 and the second dielectric layer pattern 130. The first metal layer pattern 122 is arranged within the first dielectric layer pattern 114 (e.g. in each opening 116 in the first metal layer pattern 122). The second dielectric layer pattern 130 is arranged within the second metal layer pattern 136 (e.g. the second metal layer pattern 136 surrounds the set of blocks of the second dielectric layer pattern 130).

As may be seen in FIGS. 9*a-b*, the second dielectric layer pattern 130 comprises a first portion 130*a* overlying a first portion 122*a* of the first metal layer pattern 122. The second metal layer pattern 136 comprises a first portion 136*a* overlying a second portion 122*b* (indicated by absence of a bounding box) of the first metal layer pattern 122. The second metal layer pattern 136 further comprises a second portion 136*b* (indicated by absence of a bounding box) overlying a first portion 114*a* of the first dielectric layer pattern 114. The overlap between the first portion 130*a* of the second dielectric layer pattern 130 and the first portion 122*a* of the first metal layer pattern 122 is the result of the illustrated block of the mask layer 128 (see FIGS. 6*a-b*) overlying or overlapping the first portion 122*a* of the metal liner layer 124 and a portion 126*a* of the second dielectric layer 126 (wherein portion 126*a* after patterning of the second dielectric layer 126 forms the first portion 130*a* of the second dielectric layer pattern 130).

The illustrated example shows a single discrete metal pattern part of the first metal layer pattern 122 within the opening 116 in the first dielectric layer pattern 114. However, it is to be understood that the first metal layer pattern 122 may comprise a set of plural discrete metal pattern parts, each metal pattern part formed in a respective one of a set of plural openings 116 in the first dielectric layer pattern 114. Each metal pattern that is part of the first metal layer pattern 122 may be formed with a first horizontal dimension (e.g. along the X direction) such that at least one lower metal line may be patterned therein, and/or such that at least a lower portion of a stacked metal line may be patterned therein. For example, the first horizontal dimension of a metal pattern part of the first metal layer pattern 122 may be at least N*p, where N≥ 1 and p is the (minimum) pitch of the pattern of metal lines that is to be formed in the first metal layer pattern 122. A second horizontal dimension (e.g. along the Y direction) of each metal pattern that is part of the first metal layer pattern 122 may define a maximum length of a lower or a stacked metal line which may be patterned therein.

Correspondingly, the illustrated example shows a single discrete dielectric block of the second dielectric layer pattern 130. However, it is to be understood that the second dielectric layer pattern 130 may comprise a set of multiple discrete dielectric blocks. Each dielectric block of the second dielectric layer pattern 130 may define a region in which no upper metal lines are to be formed.

Figure 10:
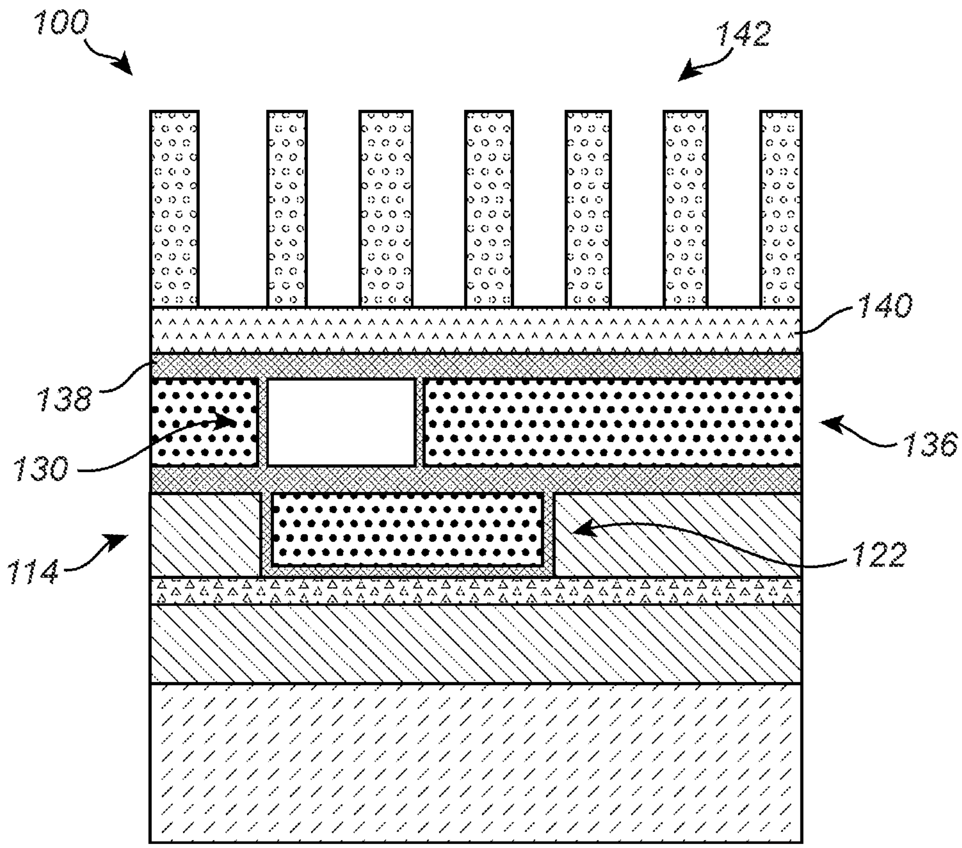
FIG. 10 schematically illustrates a method step for forming an interconnection structure, according to an example.

In FIG. 10, a mask material layer 140 has been formed over the over the intermediate layer stack of the device structure 100. The mask material of the mask line pattern may be a hard mask material, e.g. any of the dielectric hard mask materials mentioned in connection with the dielectric capping layer 106. Prior to forming the mask material layer 140, a metal liner layer 138 may be formed on top of the second dielectric layer pattern 130 and the second metal layer pattern 136. Similar to the discussion of the metal liner layer 124, the metal liner layer 138 may facilitate adhesion of the mask material layer 140 to the device structure 100. The metal liner layer 138 may however be omitted in case the mask material layer 140 already presents sufficient adhesion to the device structure 100.

An etch mask 142 defining a pattern of lines has been formed over the mask material layer 140. The pattern of lines of the etch mask 142 may be formed using single-patterning or multi-patterning techniques, such as lithography (e.g. Extreme Ultraviolet Lithography) and etching, or pitch splitting techniques such as SADP or SAQP. In the illustrated example, the etch mask 142 is formed to define a grating of lines regularly spaced apart. The method is however not so limited but it is also possible to form lines with different spacing and/or of different lengths. Further, the method is not limited to lines parallel along their entire lengths (i.e. unidirectional lines). For example, the lines of the pattern (or subsets thereof) may comprise portions extending along the X-direction and portions extending along the Y-direction. Variations in the line pattern may for example be introduced by forming cuts in the pattern of lines of the etch mask 142 prior to being transferred into the mask material layer 140.

While in the depicted example, the metal liner layer 124 (see FIG. 6*a*) and the metal liner layer 138 (see FIG. 10) are blanket-deposited, one or both may instead be deposited in an area-selective fashion using a metal-on-metal deposition process. For example, the metal liner layer 124 may be deposited selectively on an upper surface of the first metal layer pattern 122. Additionally or alternatively, the metal liner layer 138 may be deposited selectively on an upper surface of the second metal layer pattern 136. Sandwiching of redundant metal liner portions between dielectric layers of the interconnection structure may thus be avoided.

Figure 11:
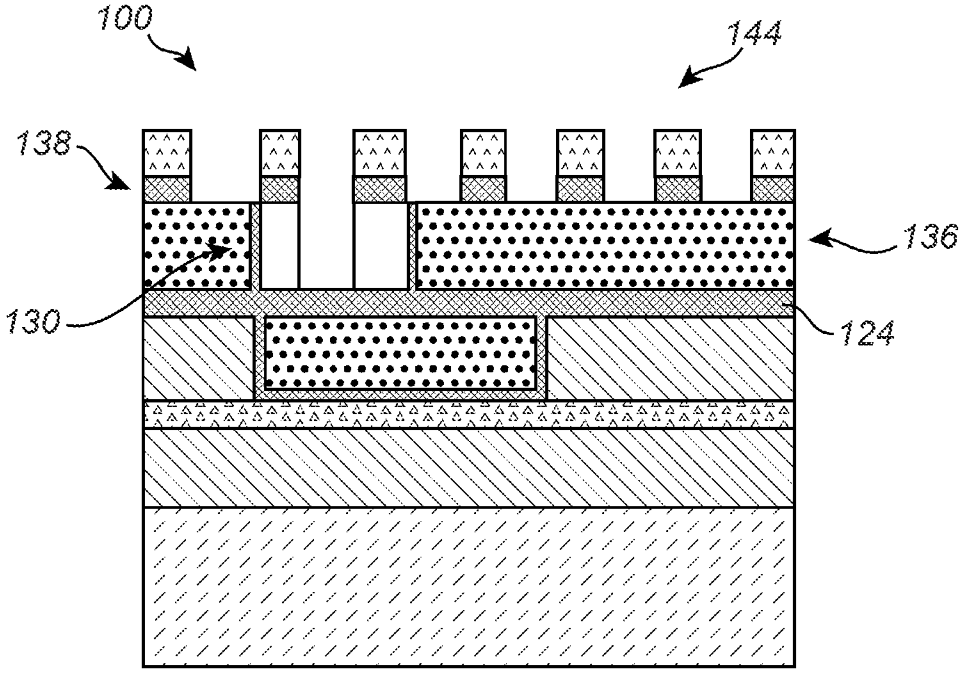
FIG. 11 schematically illustrates a method step for forming an interconnection structure, according to an example.

In FIG. 11, the etch mask 142 has been used to pattern the mask material layer 140 to define a mask line pattern 144 of the mask material, wherein the mask line pattern 144 corresponds to or conforms to the pattern of lines of the etch mask 142. The mask line pattern 144 accordingly comprises:

- a first sub-pattern of mask features overlying the first portion 130*a* of the second dielectric layer pattern 130 and the first portion 122*a* of the first metal layer pattern 122,
- a second sub-pattern of mask features overlying the first portion 136*a* of the second metal layer pattern 136 and the second portion 122*b* of the first metal layer pattern 122, and
- a third sub-pattern of mask features overlying the second portion 136*b* of the second metal layer pattern 136 and the first portion 114*a* of the first dielectric layer pattern 114.

Figure 12:
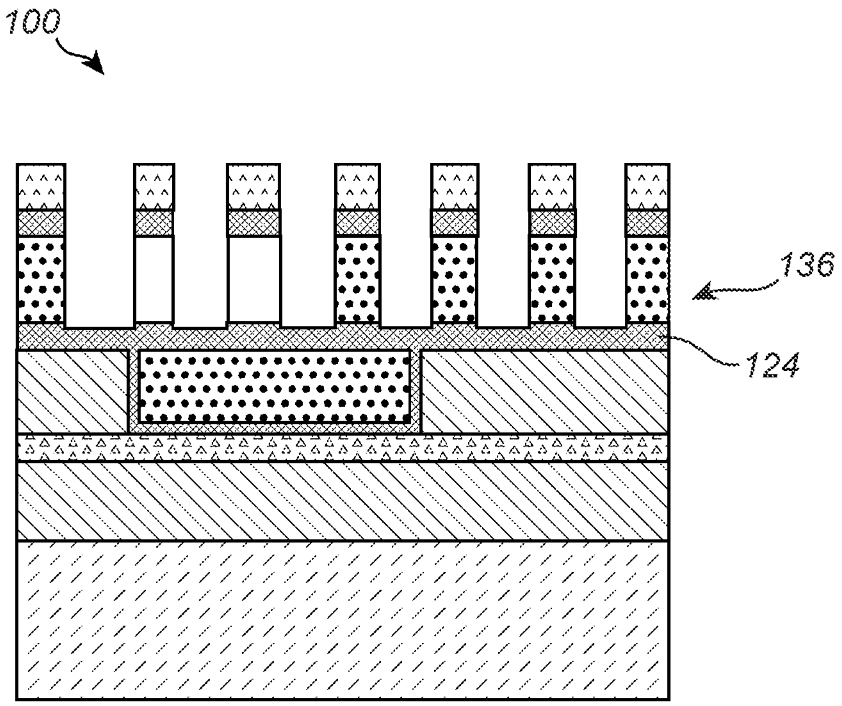
FIG. 12 schematically illustrates a method step for forming an interconnection structure, according to an example.
Figure 13A:
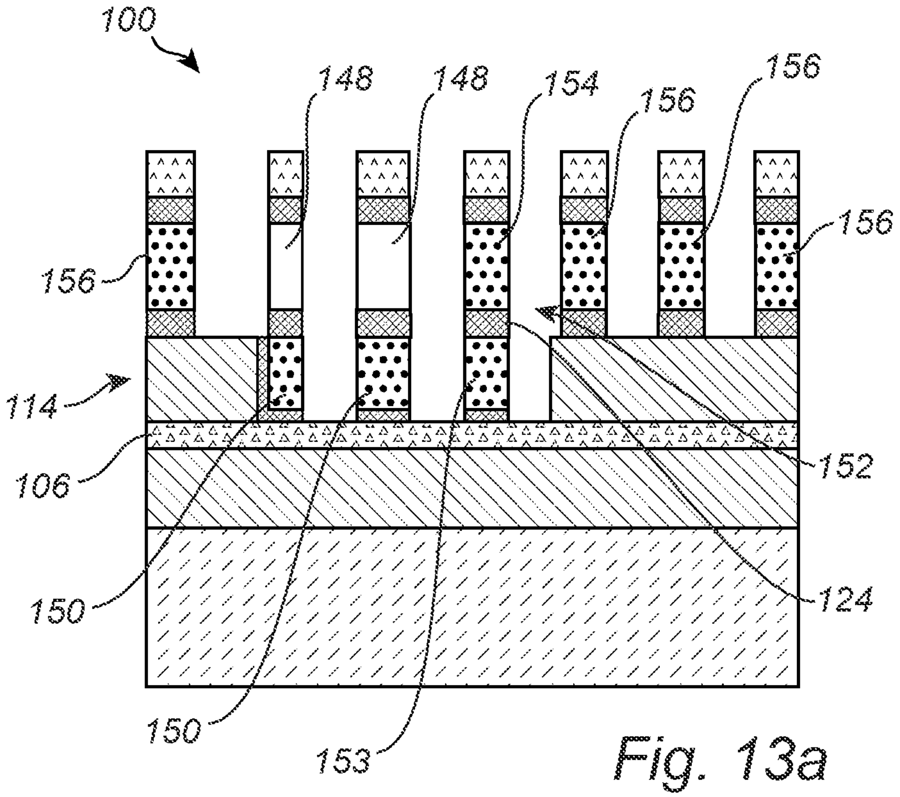
FIG. 13*a* schematically illustrates a method step for forming an interconnection structure, according to an example.
Figure 13B:
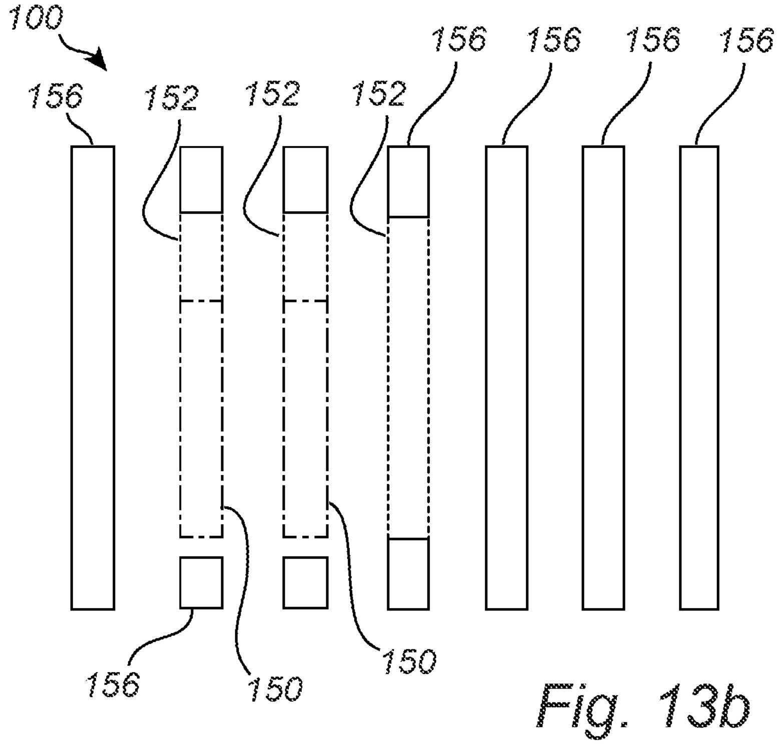
FIG. 13*b* schematically illustrates a method step for forming an interconnection structure, according to an example.

As further shown in FIGS. 11, 12 and 13*a-b*, the mask line pattern 144 has subsequently been transferred successively into the layer stack underneath. In FIG. 11 the first sub-pattern is transferred into the metal liner layer 138 and the second dielectric layer pattern 130. In FIG. 12 the second and third sub-pattern is transferred into the second metal layer pattern 136. In FIGS. 13*a-b*, the first and second sub-pattern is transferred into the first metal layer pattern 122, e.g. into the first portion 122*a*, and the second portion 122*b*, respectively, thereby completing formation of a set of lower metal lines 150 of interconnection level MX, a set of upper metal lines 156 for interconnection level MX+1, and a set of stacked metal lines 152 spanning MX and MX+1.

More specifically, and with reference to FIG. 13*a*, the set of lower metal lines 150 are formed in the first portion 122*a* of the first metal layer pattern 122. Each lower metal line 150 is capped by a dielectric line 148 formed in the first portion 130*a* of the second dielectric layer pattern 130. The set of upper metal lines 156 are formed in the second portion 136*b* of the second metal layer pattern 136. Each upper metal line 156 is formed on top of the first portion 114*a* of the first dielectric layer pattern 114. Each stacked metal lines 152 comprises a lower line portion 153 (formed in the second portion 122*b* of the first metal layer pattern 122) and, on top, an upper line portion 154 (formed in the first portion 136*a* of the second metal layer pattern 136).

In the top-down view of FIG. 13*b*, all elements except for the lower metal lines 150, the stacked metal lines 152, and the upper metal lines 156 have been omitted to more clearly illustrate their respective layouts: the lower metal lines 150 are indicated by a dash-dotted outline, the upper metal lines 156 are indicated by a solid outline, and the stacked metal lines 152 are indicated by a dashed outline.

In the illustrated example, both lower metal lines 150 and lower line portions 153 are formed (in part) in a same discrete part of the first metal layer pattern 122. This is however merely an example and it is also possible to form e.g. only lower metal lines 150 in a first discrete part of the first metal layer pattern 122 and only lower line portions 153 in another discrete part of the first metal layer pattern 122. Correspondingly, it is possible to form only upper metal lines 156 in a first discrete part of the second metal layer pattern 136 and only upper line portions 154 in another discrete part of the first metal layer pattern 122. It is further to be noted that the dielectric lines 148, the lower metal lines 150, stacked metal lines 152, upper metal lines 156 shown in FIG. 13*a* is merely an example and that the method is not limited thereto.

As per the illustrated example, the metal liner layer 124 may be used as an etch stop layer for the transfer of the first sub-pattern into the second dielectric layer pattern 130 and also for the transfer of the second and third sub-patterns into the second metal layer pattern 136. Furthermore, the dielectric capping layer 106 may be used as an etch stop layer for the transfer of the first, second, and third sub-pattern into the first metal layer pattern 122. As a non-limiting example for a layer stack comprising the dielectric capping layer 106 of SiN, a first metal layer pattern 122 and a second metal layer pattern 136 comprising a Ru fill metal, a second dielectric layer pattern 130 of SiN, a mask line pattern of SiN, and the metal liner layer 119, the metal liner layer 124, the metal liner layer 133, the metal liner layer 138 of TiN, the etching process may after patterning the mask material layer 140 to form the mask line pattern proceed as follows:

TiN of the metal liner layer 138 and portions of the metal liner layer 133 on top of the second dielectric layer pattern 130 (if present);
SiN of the second dielectric layer pattern 130;
Ru of the second metal layer pattern 136;
TiN of the metal liner layer 124;
Ru and TiN of the first metal layer pattern 122;
Stop on SiN of the dielectric capping layer 106.

As may be appreciated by the skilled person, the etching process used for the pattern transfer may comprise a number of successive etch steps comprising different chemistries selected in accordance with the specific material that is to be etched.

In the illustrated example, a set of openings 112 is patterned in the first dielectric layer 108 and a set of dielectrics blocks (i.e., the second dielectric layer pattern 130) is patterned in the second dielectric layer 126. However, it is also possible to pattern a set of dielectric blocks (corresponding to the second dielectric layer pattern 130) in the first dielectric layer 108 and a set of openings (corresponding to openings 112) in the second dielectric layer 126. The combination of openings in one of the dielectric layers and blocks in the other dielectric layer may be a convenient choice specifically for metal line patterning; the blocks may be used to define sub-regions in which no stacked metal lines are to be formed, within a densely populated region/pattern of upper metal lines (in case the blocks are patterned in the mask layer 128) or lower metal lines (in case the blocks are patterned in the first dielectric layer 108), and the openings may be used to define sub-regions in which lower metal line portions (in case the openings are patterned in the first dielectric layer 108) or upper metal line portions of stacked metal lines are to be formed. As may be appreciated, the relative populations of upper metal lines, stacked metal lines, and lower metal lines may be controlled via the relative footprints and the overlap of the openings and the blocks (more generally via the relative footprints and the overlap of the first dielectric layer pattern and the second dielectric layer pattern).

Figure 14:
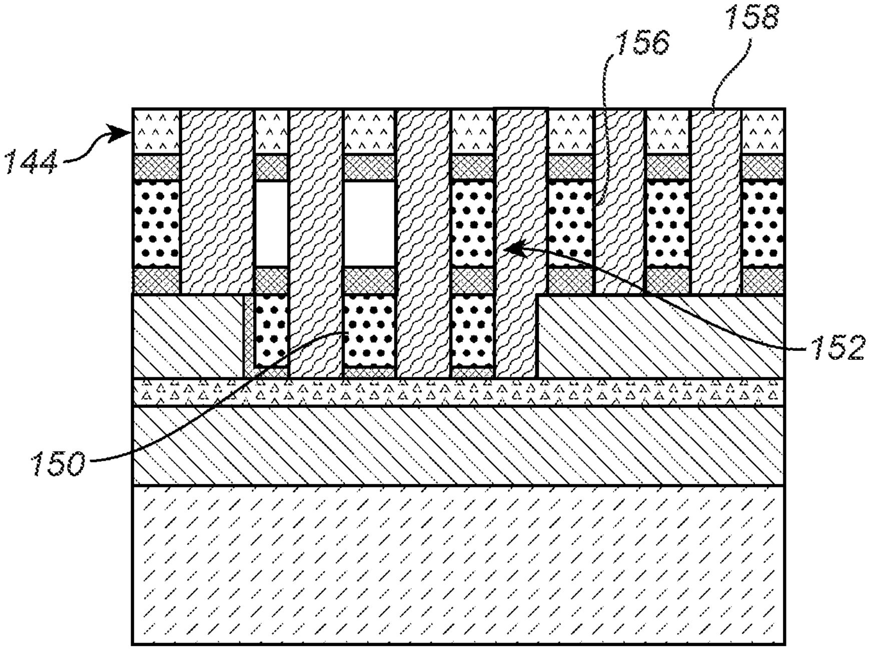
FIG. 14 schematically illustrates a method step for forming an interconnection structure, according to an example.

In FIG. 14, an interlayer dielectric 158 has been deposited to embed and cover the sets of the lower metal lines 150, the stacked metal lines 152, the upper metal lines 156, and the mask line pattern 144, and then planarized (e.g. by CMP) to expose an upper surface of the mask line pattern 144. The interlayer dielectric 158 may be formed of a same material as the interlayer dielectric 104. The mask line pattern 144 may provide a relatively large area of mask material (e.g. a dielectric hard mask material such as SiN) surrounded by the interlayer dielectric 158 (e.g. an oxide such as $SiO_2$). This may facilitate end point detection for the planarization.

Figure 17:
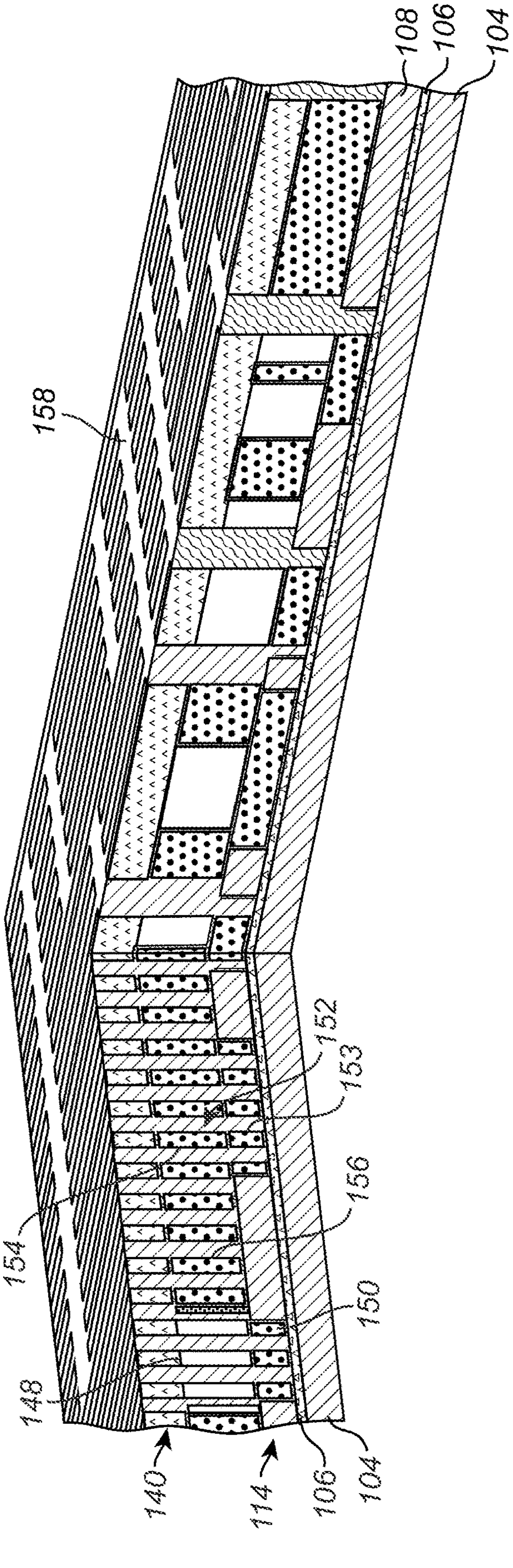
FIG. 17 is a schematic perspective view of a section of an interconnection structure which may be formed using the method illustrated in FIGS. 1-14 or using the method illustrated in FIGS. 15-16, according to an example.

FIG. 17 is a schematic perspective view of a section of an interconnection structure comprising hybrid-height metal lines (e.g. the lower metal lines 150, the stacked metal lines 152, and the upper metal lines 156) which may be formed using the method illustrated in FIGS. 1-14, wherein like reference signs refer to like elements.

Figure 15:
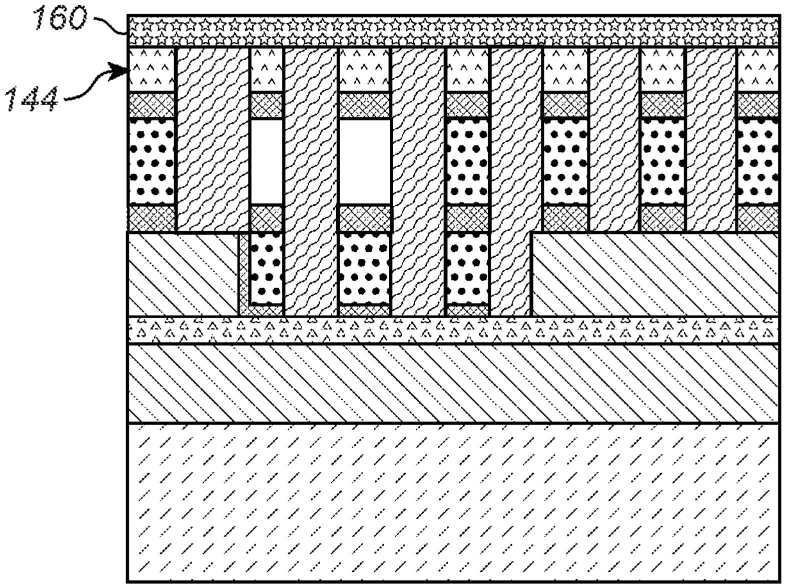
FIG. 15 schematically illustrates a method step for forming vias for an interconnection structure, according to an example.
Figure 16:
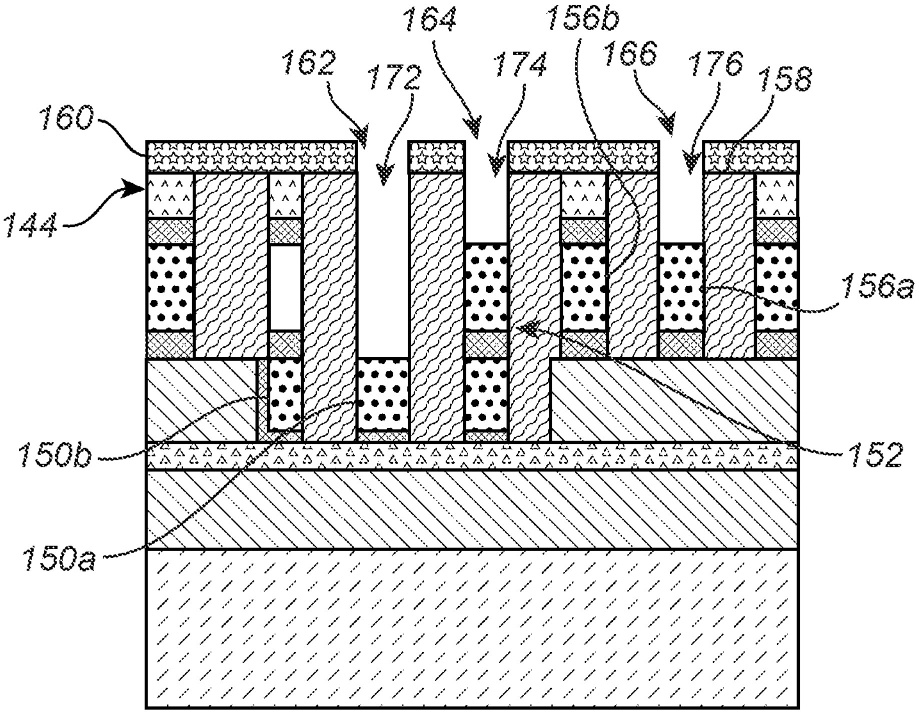
FIG. 16 schematically illustrates a method step for forming vias for an interconnection structure, according to an example.

FIGS. 15-16 depict supplementary method steps for forming metal vias that may be performed in case the metal lines of the MX and MX+1 levels are to be connected to metal lines of higher interconnection levels (e.g. MX+2).

In FIG. 15 a mask layer 160 (which may be denoted "via mask layer") has been formed over the upper interconnection level, e.g. on top of the interlayer dielectric 158 and the mask line pattern 144. The mask layer 160 may be formed of a hard mask material, e.g. any of the dielectric hard mask materials, however of a different material than the mask line pattern 144 with an etch contrast thereto, such that the mask layer 160 may be used as an etch mask during the subsequent etching of via holes.

In FIG. 16 via openings 162, via openings 164, and via openings 166 have been patterned in the mask layer 160, e.g. using a lithography and etching process. The via openings 162, the via openings 164, and the via openings 166 have been transferred into the upper interconnection level by etching while using the mask layer 160 as an etch mask, thereby forming via holes 172, via holes 174, and via holes 176 for metal vias over the lower metal lines 150, the stacked metal lines 152, and the upper metal lines 156.

More specifically, as shown, a first via hole 172 exposing an upper surface of a first lower metal line 150*a* is patterned by etching from the via opening 162. The first via hole 172 extends through a first mask line of the mask line pattern 144 overlying the first lower metal line 150*a*, and a first dielectric line of the set of dielectric lines 148 capping the first lower metal line 150*a* (and the metal liner layer 138 and/or the metal liner layer 138 124 if present).

A second via hole 174 exposing an upper surface of a stacked metal line 152 is patterned by etching from the via opening 164. The second via hole 174 extends through a second mask line of the mask line pattern 144 overlying the stacked metal line 152 (and the metal liner layer 138 if present).

A third via hole 176 exposing an upper surface of a first upper metal line 156*a* is patterned by etching from the third via opening 166. The third via hole 176 extends through a third mask line of the mask line pattern 144 overlying the first upper metal line 156*a* (and the metal liner layer 138 if present).

The etching process used for the via hole patterning may comprise a number of successive etch steps comprising different chemistries selected in accordance with the specific material that is to be etched.

The mask material of the first, second, and third dielectric lines of the mask line pattern 144 may be etched selectively to the interlayer dielectric 158, wherein the via holes 172, the via holes 174, and the via holes 176 may be self-aligned with the first lower metal lines 150*a*, the stacked metal lines 152, and the first upper metal line 156*a* underneath. Forming the first via hole may further comprise etching the dielectric material of the first dielectric line capping the first lower metal line 150*a* selectively to the interlayer dielectric 158. Hence also a lower portion of the first via hole 172 may be formed in a self-aligned manner with respect to the first lower metal line 150*a*. Etching processes and chemistries for etching e.g. conventional dielectrics and dielectric hard mask materials (e.g. SiN, AlN, $AlO_x$, or SiOC) selectively to interlayer dielectrics (e.g. $SiO_2$) are per se known in the art.

The etching process (e.g. each of the etch steps thereof) may further be adapted to not appreciably etch the fill metal of the lower metal lines 150, the stacked metal lines 152, and the upper metal lines 156. In other words, the lower metal lines 150, the stacked metal lines 152, and the upper metal lines 156 may be used as an etch stop layer for the etching process. Depending on presence of the metal liner layer 124 and/or the metal liner layer 138, the etching process may comprise an etch step for opening the metal liner layer 138 (to form the via holes 172, the via holes 174, and the via holes 176) and/or an etch step for opening the metal liner layer 124 (to form the via hole 172). These etch steps may be selective to the metal liner layer 138 or the metal liner layer 124 to not appreciably etch the surrounding dielectric and the mask layer 160.

While in the illustrated example, the first via holes 172, the second via holes 174, and the third via holes 176 are patterned simultaneously using the mask layer 160 as etch mask, it is also possible to pattern the first via holes 172, the second via holes 174, and the third via holes 176 sequentially using different etch masks. For instance, the first via holes 172 may be patterned using a first lithography and etching process and the second via holes 174 and the third via holes 176 may be patterned sequentially using a second and a third lithography and etching process, respectively, or simultaneously using a (common) second lithography and etching process.

After forming the first via holes 172, the second via holes 174, and the third via holes 176, the mask layer 160 may be removed and the via formation may be completed by filling the via holes 172, the via holes 174, and the via holes 176 with metal. Overburden metal may be removed by planarization. The metal via formed in the first via hole 172 may form a HAR via, while the metal vias in the second via holes 174 and the third via holes 176 may form LAR vias.

The method may then proceed with forming metal lines of a further interconnection level (e.g. MX+2), for instance by repeating the method steps described above, or using a conventional damascene-style process.

Figure 18:
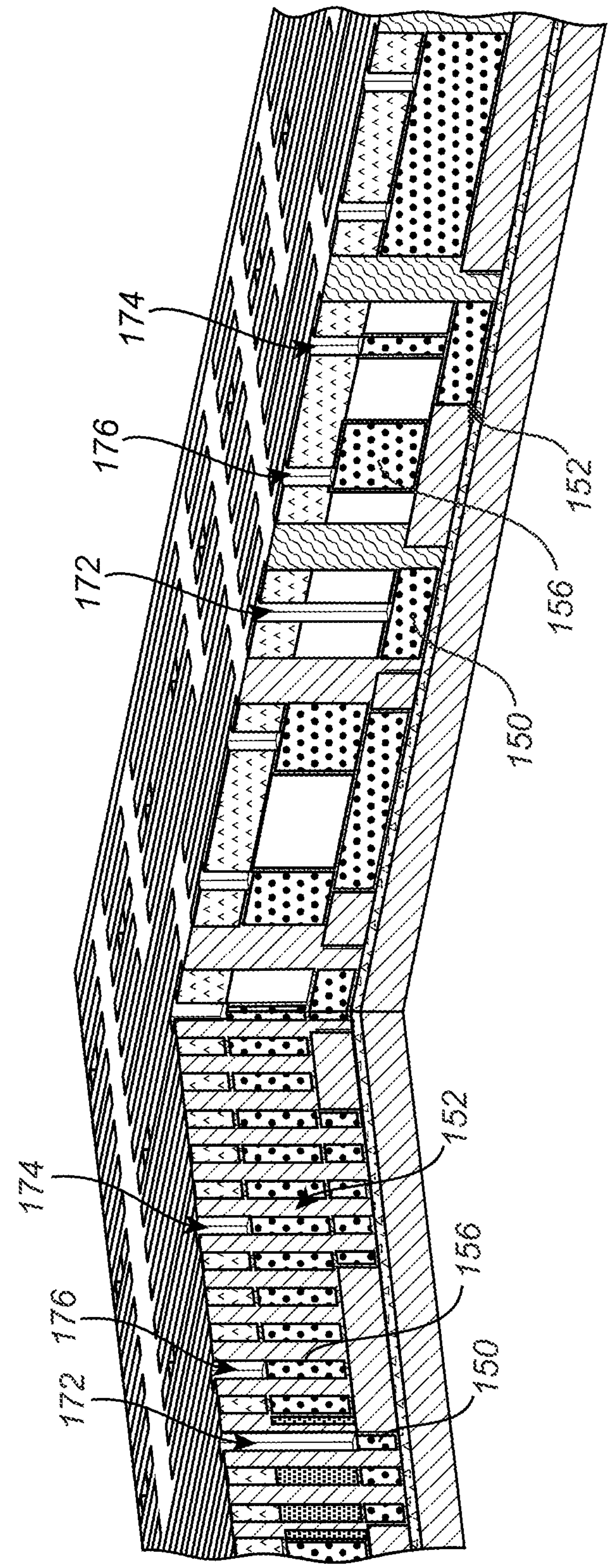
FIG. 18 is a schematic perspective view of a section of an interconnection structure which may be formed using the method illustrated in FIGS. 1-14 or using the method illustrated in FIGS. 15-16, according to an example.

FIG. 18 is a schematic perspective view corresponding to FIG. 17, wherein additionally the via holes 172 of HAR and the via holes 174 and the via holes 176 of LAR have been formed to accommodate metal vias on top of the lower metal lines 150, the stacked metal lines 152, and the upper metal lines 156.

In the above the inventive concept has mainly been described with reference to a limited number of examples. However, as is readily appreciated by a person skilled in the art, other examples than the ones disclosed above are equally possible within the scope of the inventive concept, as defined by the appended claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method comprising:

forming a first dielectric layer pattern over a substrate;

covering the first dielectric layer pattern with metal and planarizing the metal to expose an upper surface of the first dielectric layer pattern and form a first metal layer pattern;

forming a second dielectric layer pattern over the first dielectric layer pattern and the first metal layer pattern;

covering the second dielectric layer pattern with metal and planarizing the metal to expose an upper surface of the second dielectric layer pattern and form a second metal layer pattern, wherein the second dielectric layer pattern comprises a first portion overlying a first portion of the first metal layer pattern, and the second metal layer pattern comprises a first portion overlying a second portion of the first metal layer pattern, and a second portion overlying a portion of the first dielectric layer pattern;

forming a mask pattern over the second dielectric layer pattern and the second metal layer pattern, wherein the mask pattern comprises a first sub-pattern of mask features overlying the first portion of the first metal layer pattern, a second sub-pattern of mask features overlying the first portion of the second metal layer pattern, and a third sub-pattern of mask features overlying the second portion of the second metal layer pattern; and in an etching process comprising using the mask pattern as an etch mask, transferring: the first sub-pattern into the first portion of the first metal layer pattern to form a set of lower metal features, the second sub-pattern into the first portion of the second metal layer pattern and the second portion of the first metal layer pattern to form a set of stacked metal features, and the third sub-pattern into the second portion of the second metal layer pattern to form a set of upper metal features.

2. The method according to claim 1, wherein the first sub-pattern is transferred into the first portion of the second dielectric layer pattern to form a set of dielectric features, wherein the set of lower metal features are capped by the set of dielectric features.

3. The method according to claim 1, wherein forming one of the first dielectric layer pattern and the second dielectric layer pattern comprises forming a dielectric layer and patterning a set of openings in the dielectric layer, and wherein forming the other one of the first and the second dielectric layer pattern comprises forming a dielectric layer and patterning a set of dielectric blocks in the dielectric layer.

4. The method according to claim 1, further comprising, depositing an interlayer dielectric to embed and cover the sets of metal features and the mask pattern, and planarizing the interlayer dielectric to expose an upper surface of the mask pattern.

5. The method according to claim 4, wherein the interlayer dielectric comprises $SiO_2$.

6. The method according to claim 4, further comprising:

patterning a first via hole exposing an upper surface of a first lower metal feature, the first via hole extending through a first mask feature of the mask pattern overlying the first lower metal feature; and forming a first metal via in the first via hole.

7. The method according to claim 6, further comprising:

patterning a second via hole exposing an upper surface of a first stacked metal feature and extending through a second mask feature of the mask pattern overlying the first stacked metal feature; and forming a second metal via in the second via hole.

8. The method according to claim 7, further comprising:

patterning a third via hole exposing an upper surface of a first upper metal feature and extending through a third mask feature of the mask pattern overlying the first upper metal feature; and forming a third metal via in the third via hole.

9. The method according to claim 8, wherein forming the first via hole, the second via hole, or the third via hole comprises etching the mask pattern selectively to the interlayer dielectric.

10. The method according to claim 9, wherein forming the first via hole further comprises etching a dielectric material of a first dielectric feature capping the first lower metal feature selectively to the interlayer dielectric.

11. The method according to claim 1, further comprising forming a metal liner after forming the first dielectric layer pattern and the first metal layer pattern and subsequently forming the second dielectric layer pattern on the metal liner.

12. The method according to claim 1, wherein the mask pattern comprises a pattern of mask lines of the mask pattern.

13. The method according to claim 1, further comprising forming a metal liner after forming the second dielectric layer pattern and the second metal layer pattern and subsequently forming the mask pattern on the metal liner.

14. The method according to claim 13, wherein the metal liner is deposited selectively on an upper surface of the second metal layer pattern.

15. The method according to claim 13, wherein each upper metal feature and each stacked metal feature comprises a respective thickness portion of the metal liner.

16. The method according to claim 1, wherein the substrate comprises Si, silicon-on-insulator, germanium, or SiGe.

17. The method according to claim 1, further comprising providing a dielectric capping layer that comprises SiN or AlN.

18. The method according to claim 1, further comprising providing a dielectric capping layer that comprises $AlO_x$ or SiOC.

19. The method according to claim 1, wherein the first metal layer pattern comprises Ru, Mo, or W.

20. The method according to claim 1, wherein the first metal layer pattern comprises Al or Co.

* * * * *